United States Patent [19]

Verheul et al.

[11] Patent Number: 4,698,814
[45] Date of Patent: Oct. 6, 1987

[54] ARRANGEMENT FOR CHECKING THE PARITY OF PARITY-BITS CONTAINING BIT GROUPS

[75] Inventors: Hans H. Verheul; Jan Matena, both of Hilversum, Netherlands

[73] Assignee: U.S. Philips Corporation, New York, N.Y.

[21] Appl. No.: 9,114

[22] Filed: Jan. 28, 1987

Related U.S. Application Data

[63] Continuation of Ser. No. 696,628, Jan. 31, 1985, abandoned.

[30] Foreign Application Priority Data

Feb. 6, 1984 [NL] Netherlands .......................... 8400358
Jan. 31, 1986 [AT] Austria ................................... 237/86

[51] Int. Cl.⁴ ............................................. G06F 11/10
[52] U.S. Cl. ........................................ 371/49; 371/68
[58] Field of Search .......................... 371/4, 49, 51, 68

[56] References Cited

U.S. PATENT DOCUMENTS

| | | | |
|---|---|---|---|
| 3,245,049 | 4/1966 | Sakalay | 371/51 X |
| 3,602,886 | 8/1971 | Carter | 371/49 X |
| 3,732,407 | 5/1973 | Brewster | 371/49 X |
| 3,825,894 | 7/1974 | Johnson | 371/3 X |
| 3,914,741 | 10/1975 | Bonser | 371/49 |
| 4,483,003 | 11/1984 | Beal | 371/51 |

OTHER PUBLICATIONS

L. J. Kobesky "Diagnostic Parity Error Forcing Mechanism" Vol. 19, No. 3, 8/1876, p. 853.
K. Low "Shared Parity Checker" Vol. 11, No. 7, 12/1968, pp. 882-883, both from *IBM Tech. Disclosure Bulletin*.

Primary Examiner—Jerry Smith
Assistant Examiner—Robert W. Beausoliel, Jr.
Attorney, Agent, or Firm—Thomas A. Briody; Jack Oisher; Streeter: William J.

[57] ABSTRACT

A logic circuit for checking the parity of many bit groups simultaneously and jointly. The parity bits generated by the parity generators are interchanged crosswise, combined with the parity bits contained in the bit groups and applied to a single common output terminal. Consequently, only one specific output must be checked. The checking circuit itself is checked by inverting one of the parity generators periodically.

2 Claims, 1 Drawing Figure

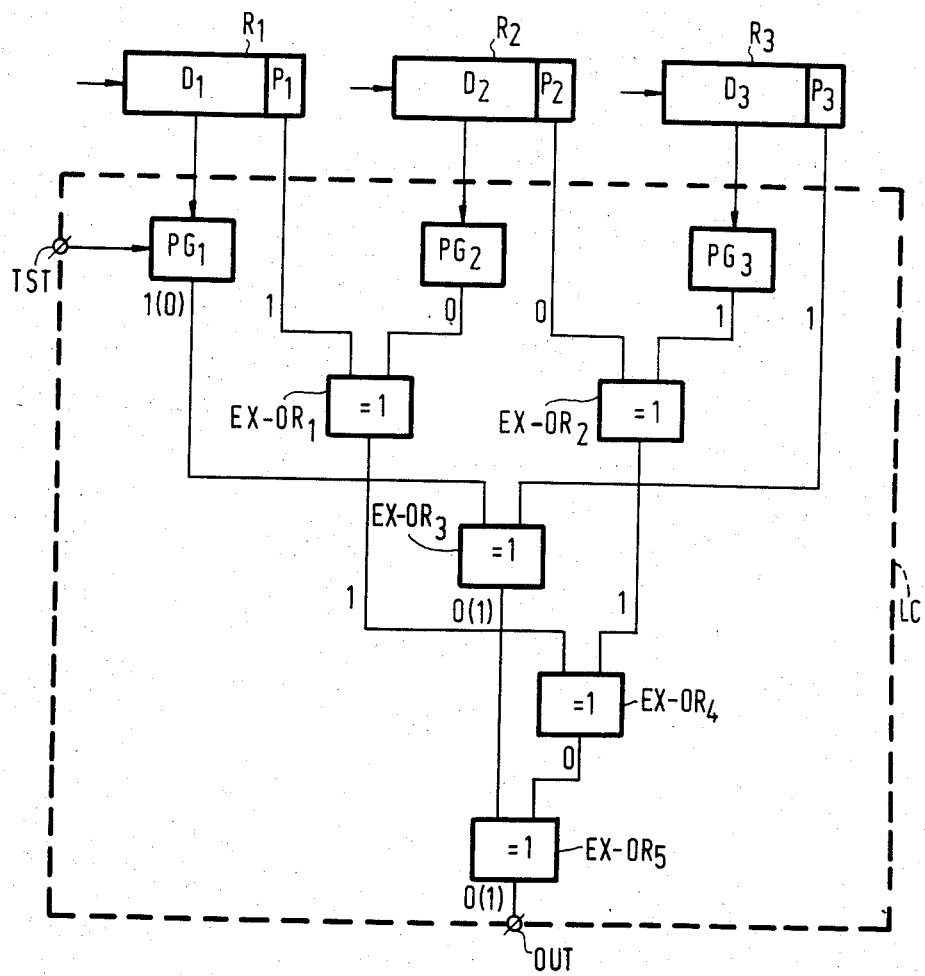

ARRANGEMENT FOR CHECKING THE PARITY OF PARITY-BITS CONTAINING BIT GROUPS

This is a continuation of application Ser. No. 696,628, filed Jan. 31, 1985, and now abandoned.

BACKGROUND OF THE INVENTION

The invention relates to an arrangement for checking the parity of parity bit-containing bit groups.

Such an arrangement is generally known.

If in a system such as a telephone exchange, the parity of a bit group has to be determined in a large number of places, or the parity of many bit groups have to be checked in one place, this requires a large investment in equipment, such as parity generators and convertors. In addition, the result of the comparison between the transmitted parity of the bit group and the parity generated by the parity generator has to be checked, which requires additional hardware. To ensure the reliability of the system all the additional equipment must also be supervised.

SUMMARY OF THE INVENTION

The invention has for its object to provide an arrangement for checking the parity of parity bit-containing bit groups, with the aid of which the parity can be checked using only few means and with which also the reliability of these means can be supervised. According to the invention, an arrangement for checking the parity of parity bit-containing bit groups is characterized in that a number of n bit groups are checked in parallel. The arrangement comprises n parity generators (PG1, PG2, PG3) each coupled to one bit group for generating the parity of the relevant bit group, and the arrangement further comprises n comparison circuits each having first and second inputs and an output. An output of a parity generator is always connected to a first input of a comparison circuit, and the parity bit of each of the bit groups is applied to the second input of the comparison circuit but in such manner that at a specific comparison circuit the generated parity bit applied to the first input is derived from a different bit group than the parity bit applied to the second input. The outputs of the comparison circuits are connected to a logic network for generating, at a single output terminal of the logic network, a logic signal which has a first value if all the generated parity bits are in agreement with the parity bit contained in the bit groups and a second value if one of the generated parity bits is not in agreement with the parity bit of the associated bit group.

An advantageous embodiment of such an arrangement for checking the parity of parity bit-containing bit groups is characterized in that one of the parity generators may have a test input for inverting the parity bit generated at the output of that parity generator, as a result of which the signal generated at the output of the logic network will be inverted if the logic network is correctly operating in the prescribed way.

BRIEF DESCRIPTION OF THE DRAWING

An embodiment of the invention will now be described, by way of example, with reference to the accompanying drawing, the sole FIGURE of which shows in block schematic form an arrangement for checking the parity of parity bit containing bit groups.

DESCRIPTION OF THE PREFERRED EMBODIMENT

References $R_1$, $R_2$ and $R_3$ denote a number of binary registers for storing a bit group consisting of a data portion $D_1$, $D_2$ and $D_3$, respectively and a parity portion $P_1$, $P_2$ and $P_3$, respectively. The invention is however not limited to embodiments comprising three registers. The invention can also be used without any drawbacks for any other number of registers. Parity generators PG1, PG2 and PG3 for generating the parity of the bit group data portion present in the data portion of the register are connected to an output of each data portion $D_1$, $D_2$ and $D_3$ of the registers $R_1$, $R_2$ and $R_3$, respectively.

An output of each of the parity generators $PG_1$, $PG_2$ and $PG_3$ and an output of each of the parity portions $P_1$, $P_2$ and $P_3$ of the registers $R_1$, $R_2$ and $R_3$ are together connected to a logic circuit LC of which the exclusive OR-circuits $EX\text{-}OR_1$, $EX\text{-}OR_2$, $EX\text{-}OR_3$ form part. This is effected in such a way that the inputs of these circuits are connected in a cyclic sequence to outputs of different parity portions and parity generators. This means that the output of the parity portion $P_1$ of register $R_1$ is connected to a first input of the exclusive OR-circuit $EX\text{-}OR_1$, while the output of parity generator $PG_2$ is connected to a second input of the exclusive OR-circuit $EX\text{-}OR_1$. Similarly, the output of the parity portion of register $R_2$ is connected to the first and the output of parity generator $PG_3$ to the second input of $EX\text{-}OR_2$ and the output of the parity portion of register $R_3$ is connected to the first and the output of parity generator $PG_1$ to the second input of $EX\text{-}OR_3$. Outputs of the exclusive OR-circuits $EX\text{-}OR_1$ and $EX\text{-}OR_2$ are connected to first and second inputs, respectively of a further exclusive OR-circuit $EX\text{-}OR_4$, while an output of the exclusive OR-circuit $EX\text{-}OR_3$ and an output of $EX\text{-}OR_4$ are connected to a fifth exclusive OR-circuit $EX\text{-}OR_5$. The output of $EX\text{-}OR_5$ is connected to an output terminal OUT which constitutes the output terminal of the logic circuit LC.

The checking circuit operates as follows. If the parities generated by the parity generators $PG_1$, $PG_2$ and $PG_3$ correspond to the parity which was transmitted and stored in the parity portions $P_1$, $P_2$ and $P_3$ of the registers, then at output OUT a logic value of a first type will be supplied. In the example shown in the drawing $PG_1=P_1=\text{``}1\text{''}$, $PG_2=P_2=\text{``}0\text{''}$ and $PG_3=P_3=\text{``}1\text{''}$ a signal having the logic value "0" will occur at output OUT. In all cases in which each generated parity ($PG_i$) corresponds to the parity contained in the corresponding parity portion $P_i$ a logic value "0" will always appear at the output OUT. Consequently, this circuit has the advantage that for every three bit groups (n-bit groups in general) only a single output terminal need to be checked. If an error occurs, so that any of the parity generators generates a parity which differs from the parity bit stored in the register, then the output OUT will assume the second logic value ("1"), which is indicative of the occurrence of an error.

Now it may happen that a malfunction occurs in the logic circuit LC causing a logic signal of the first type to be always supplied from the output, so that prevailing errors cannot be indicated anymore. To check this, one of the parity generators $PG_1$, $PG_2$ or $PG_3$ (in the drawing $PG_1$) is given a test input TST. Applying a suitable signal to the test input TST causes the output of the relevant parity generator ($PG_1$ in the drawing) to be inverted. When the logic circuit is supplying from the output OUT a logic signal of a first value (e.g. a zero), application of such a test signal should result in this value being inverted to a second value (e.g. a one). If no such inversion occurs, this indicates that the logic circuit LC is operating incorrectly. Inverting one of the parity generators at regular time intervals prevents a the logic circuit LC which becomes defective remaining unnoticed.

What is claimed is:

1. A logic circuit for checking in parallel the parity of each of a plurality of parity bit-containing bit groups, such logic circuit having a single output terminal and comprising: n parity generators ($Pg_1$, $PG_2$, ... $PG_n$) each coupled to a bit group for generating the parity bit of said bit group; n comparison circuits each having first and second inputs and an output, an output of each of said parity generators being connected to a first input of a comparison circuit, the parity bit of each of said bit groups being applied to said second input of said comparison circuit in such manner that at a specific comparison circuit the generated parity bit applied to said first input is derived from a different bit group than the parity bit applied to said second input, the outputs of said comparison circuits being connected so as to produce, at said output terminal of said logic network, a logic signal which has a first value only if each of said generated parity bits is in agreement with the parity bit contained in the corresponding bit group and which has a second value if any of said generated parity bits is not in agreement with the parity bit of the corresponding bit group.

2. A logic circuit as claimed in claim 1, characterized in that one of said parity generators has a test input for inverting the parity bit generated at the output of said one parity generator, in response to which said logic signal generated at said signal output terminal of said logic network is inverted only if said logic circuit is operating in a prescribed manner.

* * * * *